(12) United States Patent
Ohhira et al.

(10) Patent No.: US 8,519,336 B2
(45) Date of Patent: Aug. 27, 2013

(54) INFRARED SENSOR AND INFRARED SENSOR MODULE

(75) Inventors: Makoto Ohhira, Kizugawa (JP); Fumiji Aita, Nara (JP); Yutaka Koyama, Nara (JP); Sho Sasaki, Joyo (JP)

(73) Assignee: OMRON Corporation, Kyoto (JP)

(*) Notice: Subject to any disclaimer, the term of this patent is extended or adjusted under 35 U.S.C. 154(b) by 318 days.

(21) Appl. No.: 12/980,227

(22) Filed: Dec. 28, 2010

(65) Prior Publication Data

US 2011/0155914 A1  Jun. 30, 2011

(30) Foreign Application Priority Data

Dec. 28, 2009 (JP) ................. 2009-298554

(51) Int. Cl.
*G01J 5/02* (2006.01)
*G01J 5/20* (2006.01)

(52) U.S. Cl.
USPC ..................... 250/338.4; 250/339.02

(58) Field of Classification Search
USPC .......................... 250/338.4, 339.02
See application file for complete search history.

(56) References Cited

U.S. PATENT DOCUMENTS

| | | | |
|---|---|---|---|
| 4,754,139 A * | 6/1988 | Ennulat et al. ............ | 250/332 |
| 2003/0141455 A1 | 7/2003 | Lambert et al. | |
| 2005/0017175 A1 | 1/2005 | Lee et al. | |
| 2008/0128620 A1 | 6/2008 | Krellner et al. | |

FOREIGN PATENT DOCUMENTS

| | | |
|---|---|---|
| DE | 10 2007 057037 A1 | 5/2009 |
| JP | 06229821 A | 8/1994 |
| JP | 11-258038 A | 9/1999 |
| JP | 11-258040 A | 9/1999 |
| JP | 11-258041 A | 9/1999 |
| JP | 2000-065639 A | 3/2000 |
| JP | 2000-221080 A | 8/2000 |
| JP | 2000-292254 A | 10/2000 |
| JP | 2007-313594 A | 12/2007 |

OTHER PUBLICATIONS

Extended Search Report for European Application No. 10197118.2 mailed May 11, 2011 (6 pages).
Patent Abstract for Japanese Publication No. 06229821 Published Aug. 19, 1994 (1 page).
espacenet, Patent Abstract for Germany Application No. 10200705737 dated May 28, 2009 (1 page).

* cited by examiner

*Primary Examiner* — David Porta
*Assistant Examiner* — Kenneth J Malkowski
(74) *Attorney, Agent, or Firm* — Osha Liang LLP

(57) ABSTRACT

The present invention provides an infrared sensor and an infrared sensor module having reduced noise, improved detection precision, and reduced manufacture cost. The infrared sensor includes a first substrate transmitting infrared light including at least one reduced-pressure and sealed cavity, at least one infrared sensing unit provided on the side of the first substrate, and at least one infrared sensing unit generating an output change. The infrared sensor includes a second substrate stacked on the first substrate with a recess, a reflection face capable of reflecting the infrared light, and at least one arithmetic circuit for amplifying or integrating an output, arranged in such a manner that the reflection face is sandwiched between the at least one sensing unit and the least one arithmetic circuit.

8 Claims, 19 Drawing Sheets

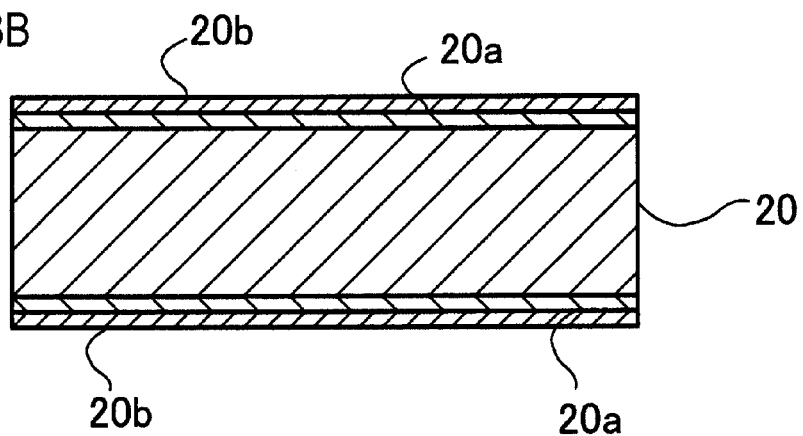
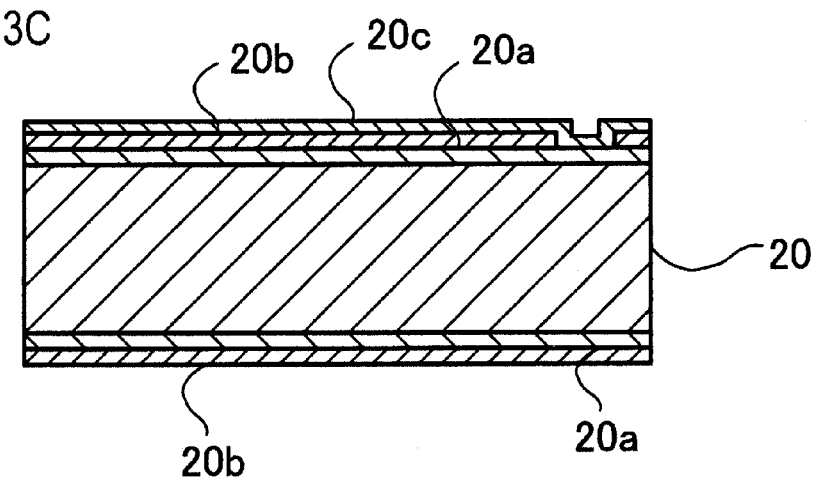

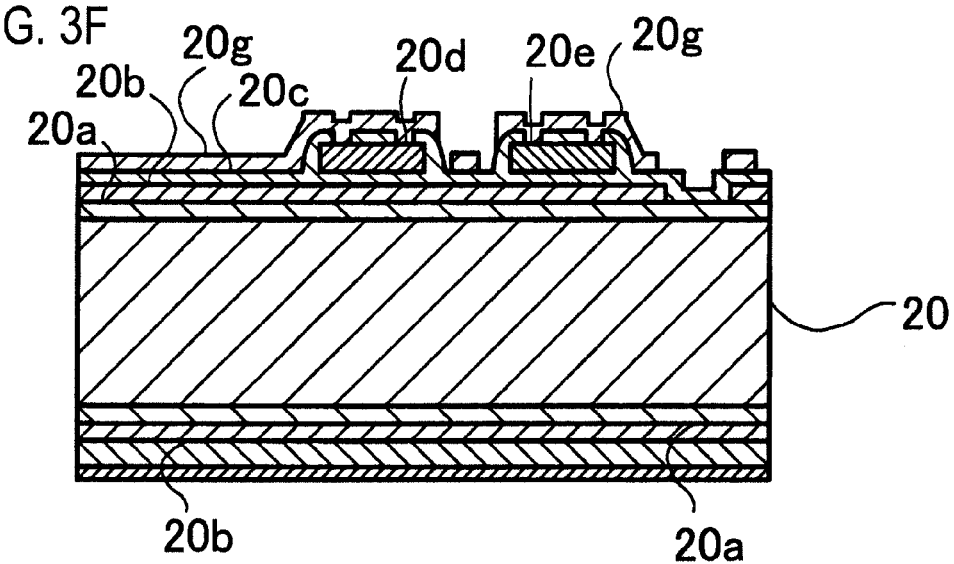
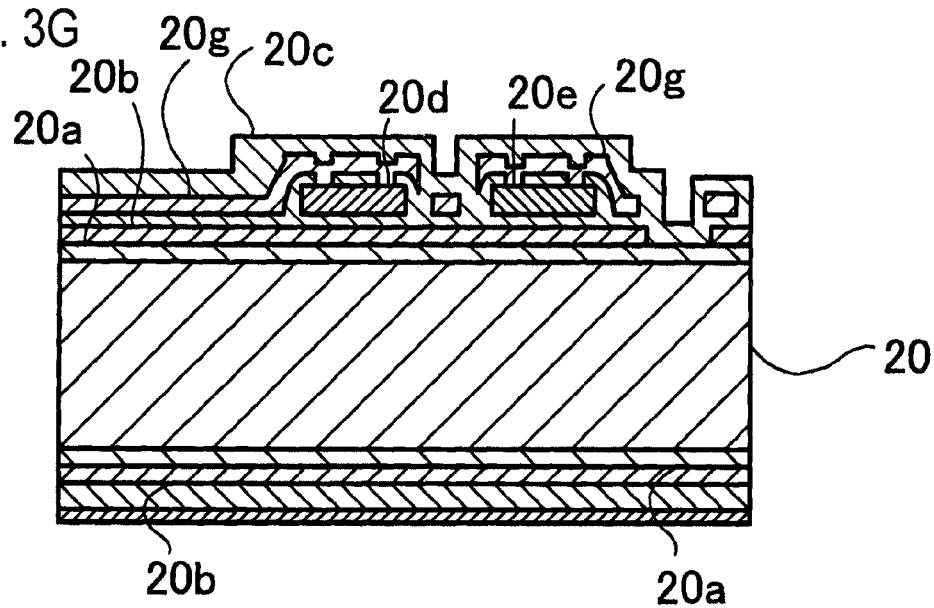

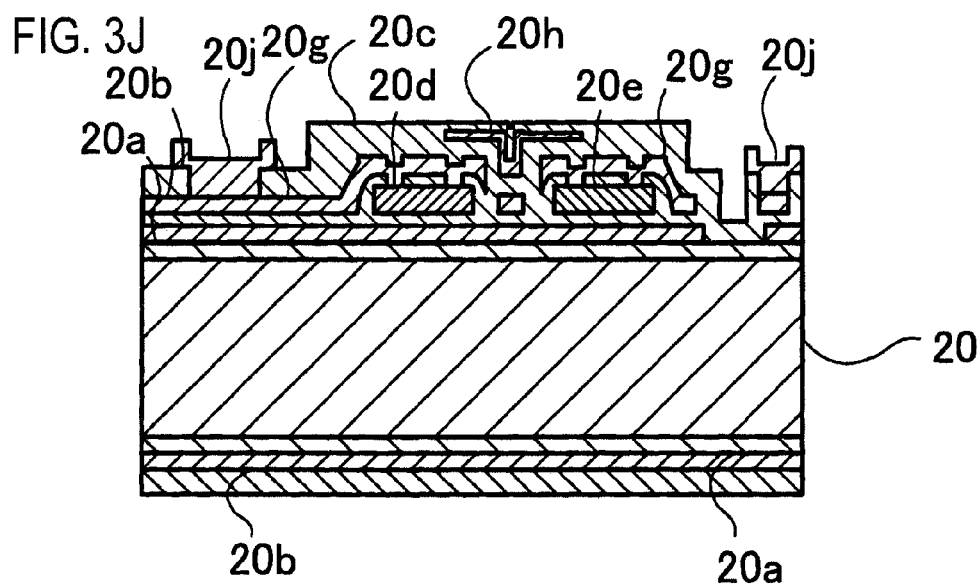
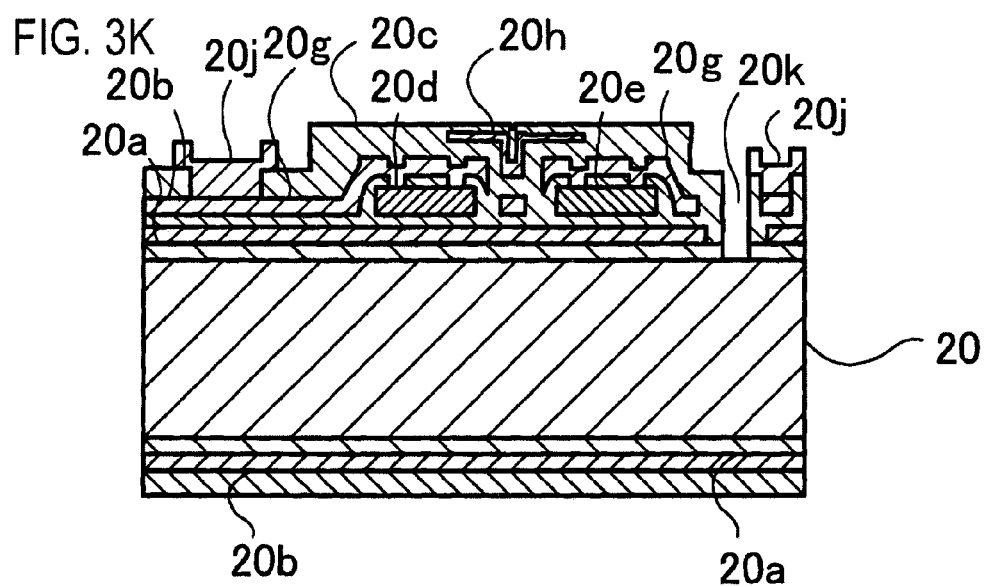

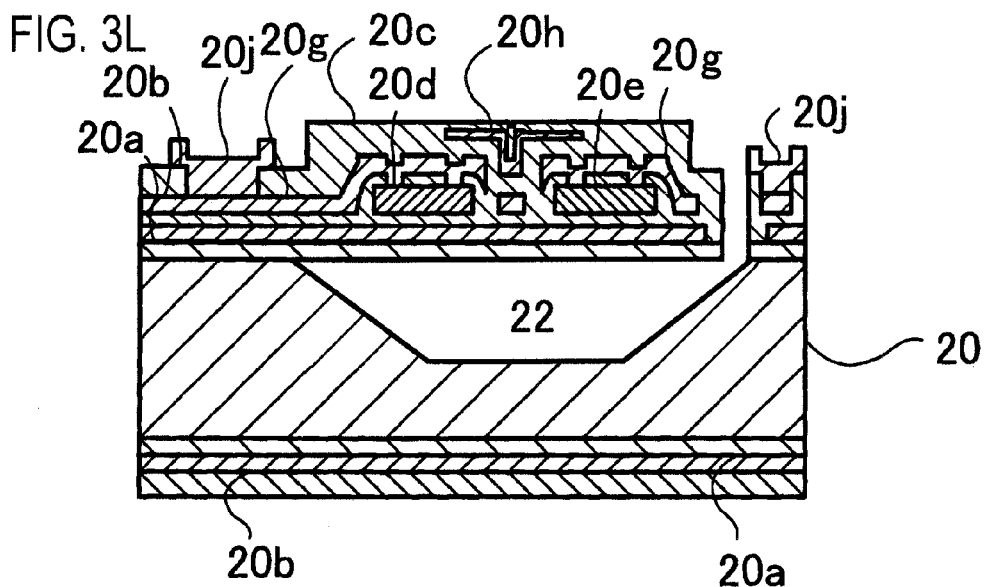
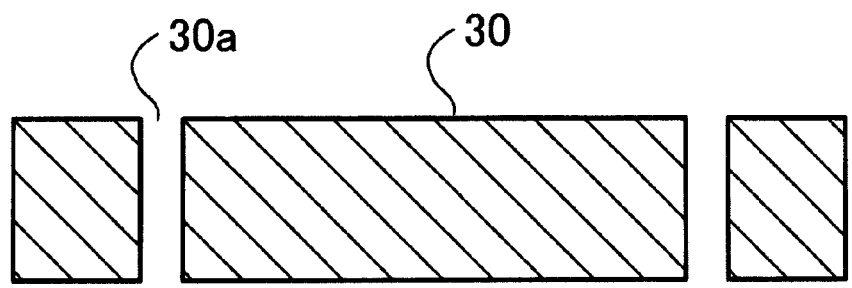
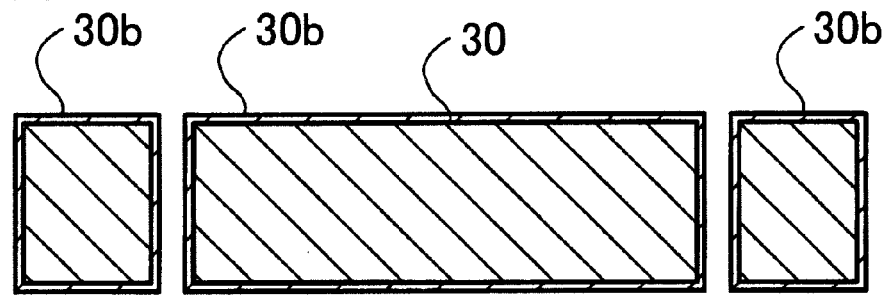

FIG. 4D1

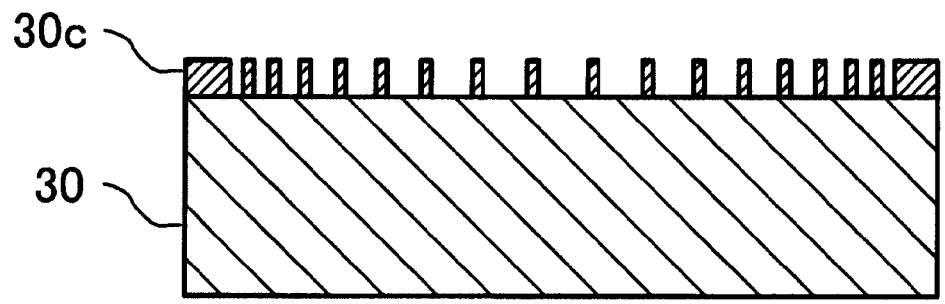
FIG. 4D2
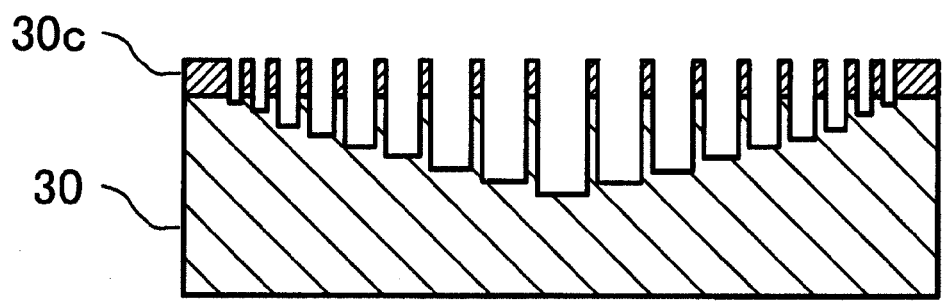
FIG. 4D3
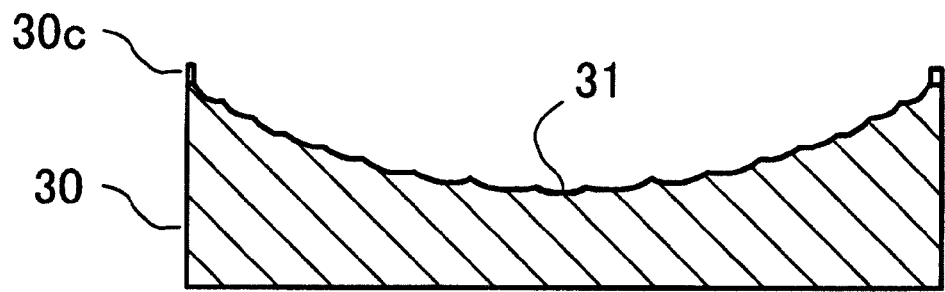
FIG. 4D4

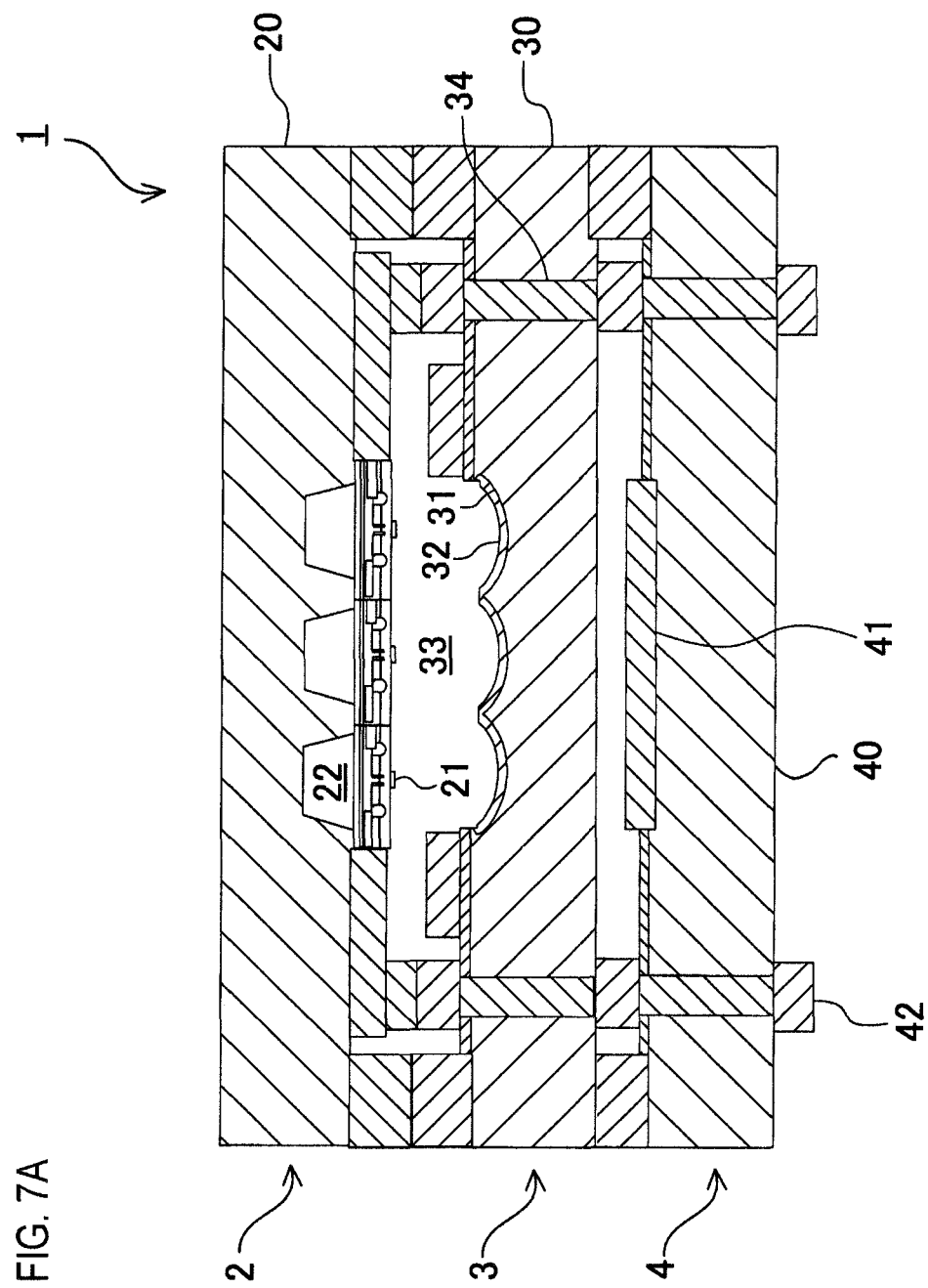

INFRARED SENSOR AND INFRARED SENSOR MODULE

BACKGROUND OF THE INVENTION

1. Field of the Invention

The present invention relates to an infrared sensor and an infrared sensor module.

2. Description of the Related Art

Hitherto, an infrared sensor using, as a sensing unit, an element (thermopile) that generates voltage when heat is applied is known (refer to Japanese Patent Application Laid-Open Nos. H06-229821, H11-258038, H11-258040, H11-258041, 2000-65639, 2000-221080, and 2000-292254). The thermopile receives infrared light emitted from an object and, when a temperature difference occurs, generates a voltage difference corresponding to the temperature difference due to the so-called Seebeck effect. By detecting the voltage difference as a function of the temperature change, the temperature of an object can be sensed.

Such an infrared sensor is used as a sensor module in which a plurality of sensing units is arranged in the vertical and horizontal directions (in an array) in a vacuum-sealed case in order to suppress deterioration in sensitivity caused by dispersion of heat into air.

Each of the sensing units receives infrared light incident from an infrared transmission window (infrared filter) formed in the case and outputs voltage. Since an output signal from the sensing unit is small, it is amplified or integrated by an arithmetic circuit or the like.

However, a conventional infrared sensor has a configuration such that the arithmetic circuit is mounted in a position apart from the sensing unit, and noise tends to occur in the output signal from the sensing unit. For miniaturization of the sensor, the conventional infrared sensor is constructed to process output signals of all of the sensing units in the sensor array by one or a few arithmetic circuits. By connecting the plurality of sensing units to one arithmetic circuit, the sampling frequency be comes high, and it causes noise.

Japanese Patent Application Laid-Open No. 2007-313594 discloses a stacked device directed to reduce the size of a chip and shorten interconnection by stacking the sensor unit and the arithmetic circuit. However, in an infrared sensor so configured, heat (infrared light) generated by the arithmetic circuit may cause noise in the infrared sensor.

Moreover, a work of mounting the sensing units in the vacuum-sealed case includes a complicated work such as degasifying work, and expensive parts, special adhesive, and the like are necessary for the case requested to have high air tightness. Therefore, the conventional configuration in which the sensing units are housed in the vacuum-sealed case has a problem also from the viewpoint of manufacture cost.

SUMMARY OF THE INVENTION

An object of the present invention is to provide an infrared sensor and an infrared sensor module having reduced noise, improved detection precision, and reduced manufacture cost.

The present invention employs the following means to achieve the object.

An infrared sensor according to the present invention includes a first substrate transmitting infrared light and comprising at least one reduced-pressure and sealed cavity and, at least one infrared sensing unit provided on the side of the first substrate opposite to the side intended to receive infrared light from the outside, the at least one infrared sensing unit generating an output change upon receipt of the infrared light passed through the at least one reduced-pressure and sealed cavity, a second substrate stacked on the first substrate and comprising at least one recess forming a reduced-pressure space surrounding the at least one infrared sensing unit in cooperation with the first substrate, and a reflection face capable of reflecting the infrared light passed through the first substrate and not intercepted by the at least one infrared sensing unit toward the sensing unit, and at least one arithmetic circuit amplifying or integrating an output of the at least one infrared sensing unit, the at least one arithmetic circuit being arranged in such a manner that the reflection face is sandwiched between the at least one infrared sensing unit and the at least one arithmetic circuit.

According to the present invention, since the infrared sensing unit and the arithmetic circuit are integrated, the distance between the sensing unit and the arithmetic circuit can be short. Therefore, reduction of noise can be achieved and detection precision can be improved. Heat (infrared) generated in the arithmetic circuit is interrupted by the reflection face existing between the infrared sensing unit and the arithmetic circuit. Therefore, an influence on the sensing unit exerted by the heat of the arithmetic circuit is suppressed, so that noise can be reduced and the detection precision can be improved.

Since the infrared light incident on the sensing unit passes through the pressure-reduced and sealed cavity and the pressure-reduced space, temperature can be detected with high sensitivity. The infrared light passed through the first substrate and not intercepted by the infrared sensing unit depending on the incident position and the incident angle is reflected and focused by the reflection face toward the infrared sensing unit. Thus, detection sensitivity can be improved.

Preferably, the cavity is formed as a cavity which is open on the side on which the second substrate is stacked, and the cavity and the reduced-pressure space are subjected to a reduced pressure and sealed by stacking and bonding together the first and second substrates under low pressure atmosphere.

Thanks to the configuration of the infrared sensor, the pressure reduction and sealing of the cavity and the formation of the reduced-pressure space can be performed easily. Therefore, manufacturability can be improved and the manufacture cost can be reduced.

Preferably, the infrared sensing unit and the arithmetic circuit are connected by connecting means penetrating the second substrate in a stack direction.

Thanks to the configuration of the infrared sensor, a compact stacked structure can be realized, and the sensor can be miniaturized. Therefore, reduction in noise and improvement in detection precision can be realized.

The infrared sensor preferably includes a plurality of connecting means.

The plurality of connecting means may comprise interconnections which can be used as electrodes of a capacitor for integrating an output signal of the sensing unit. Therefore, it becomes unnecessary to separately or additionally provide a capacitor for the integration circuit. Thus, miniaturization of the sensor can be realized.

The infrared sensor preferably includes a plurality of infrared sensing units, and preferably includes a plurality of arithmetic circuits corresponding to the plurality of sensing units.

By performing the arithmetic process of amplification or integration by one arithmetic circuit for one infrared sensing unit, detection with high precision is realized.

The arithmetic circuit may be formed on side opposite to the side on which the first substrate is stacked in the second substrate.

According to one embodiment, the infrared sensor may further comprise a third substrate stacked on the side of the second substrate opposite to the first substrate, and the arithmetic circuit may be formed on the third substrate.

That is, the arithmetic circuit may be directly mounted on the second substrate, or may be formed on third substrate different from the second substrate and integrated in the senor by stacking the third substrate on the second substrate.

An infrared sensor module according to the present invention includes an infrared sensor as defined above, and a case housing the infrared sensor.

According to the infrared sensor module of the present invention, the reduced-pressure space which increases precision of detection of the infrared sensing unit is formed in the sensor itself, so that it is unnecessary to reduce the pressure in the case housing the infrared sensor. Therefore, the number of manufacturing process steps of the module can be reduced.

In addition, air tightness is not required by the case itself, so that the variety of the materials of the case and of the adhesives can be widened. Therefore, the material cost can be reduced and the manufacture cost can be reduced.

As described above, thanks to the present invention, reduction in noise and improvement in detection precision can be realized, and the manufacture cost can be reduced.

BRIEF DESCRIPTION OF THE DRAWINGS

FIG. 3B is a schematic view for explaining the method for manufacturing an infrared detecting device;

FIG. 3C is a schematic view for explaining the method for manufacturing an infrared detecting device;

FIG. 3F is a schematic view for explaining the method for manufacturing an infrared detecting device;

FIG. 3G is a schematic view for explaining the method for manufacturing an infrared detecting device;

FIG. 3J is a schematic view for explaining the method for manufacturing an infrared detecting device;

FIG. 3K is a schematic view for explaining the method for manufacturing an infrared detecting device;

FIG. 3L is a schematic view for explaining the method for manufacturing an infrared detecting device;

FIG. 4A is a schematic view for explaining a method for manufacturing a reflection layer;

FIG. 4B is a schematic view for explaining the method for manufacturing a reflection layer;

FIG. 4D1 is a schematic view for explaining the method for manufacturing a reflection layer;

FIG. 4D2 is a schematic view for explaining the method for manufacturing a reflection layer;

FIG. 4D3 is a schematic view for explaining the method for manufacturing a reflection layer;

FIG. 4D4 is a schematic view for explaining the method for manufacturing a reflection layer;

FIG. 7A is a schematic cross-sectional view of the infrared sensor according to an embodiment of the present invention;

DETAILED DESCRIPTION OF EMBODIMENTS

A mode for carrying out the present invention will be described below illustratively specifically based on an embodiment with reference to the drawings. Dimensions, materials, shapes, and relative layout of components described in the detailed description of one embodiment are exemplary and not limiting, unless otherwise specified.

Embodiment

Figure 1:
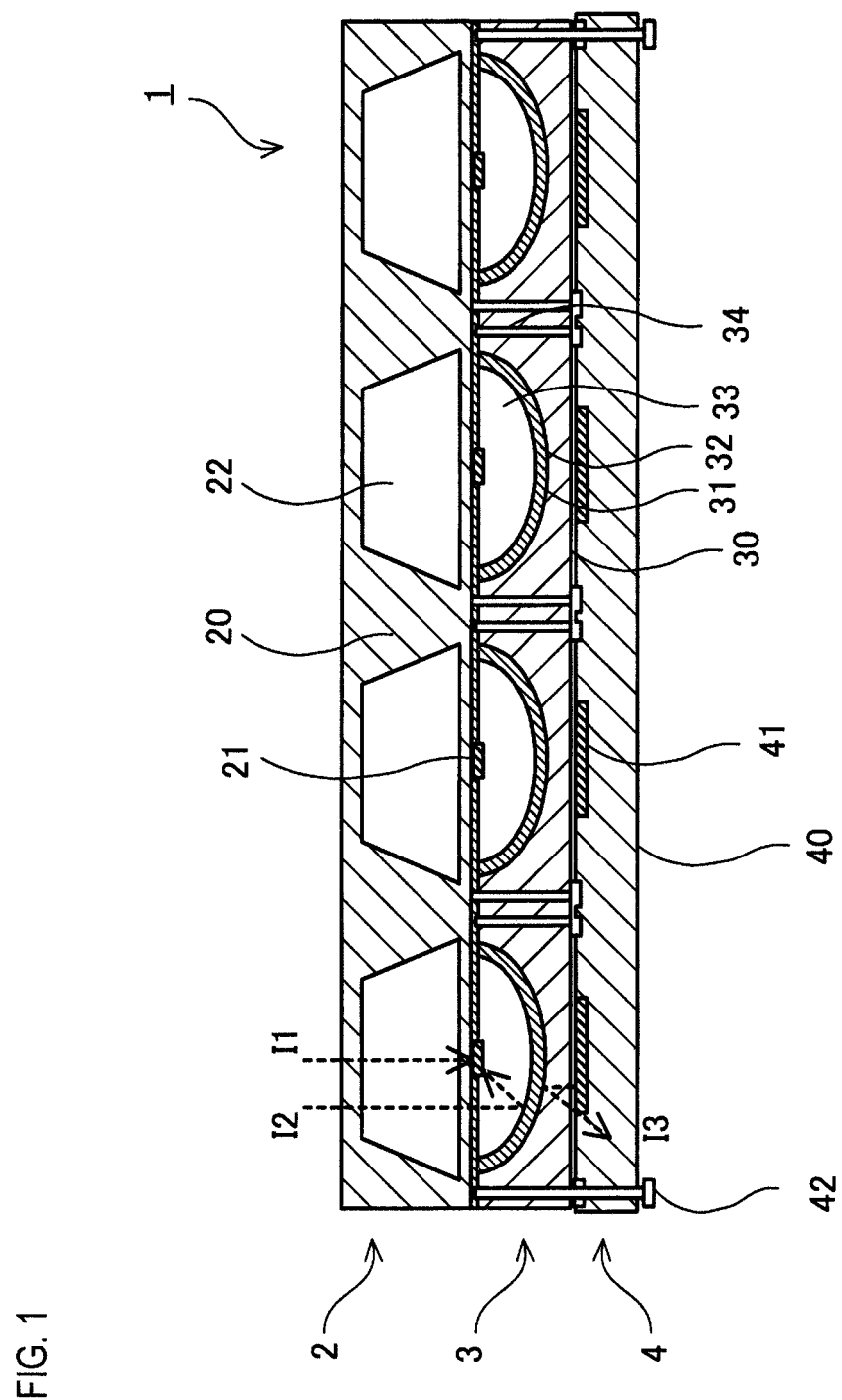
FIG. 1 is a schematic cross-sectional view of an infrared sensor according to an embodiment of the invention.
Figure 2:
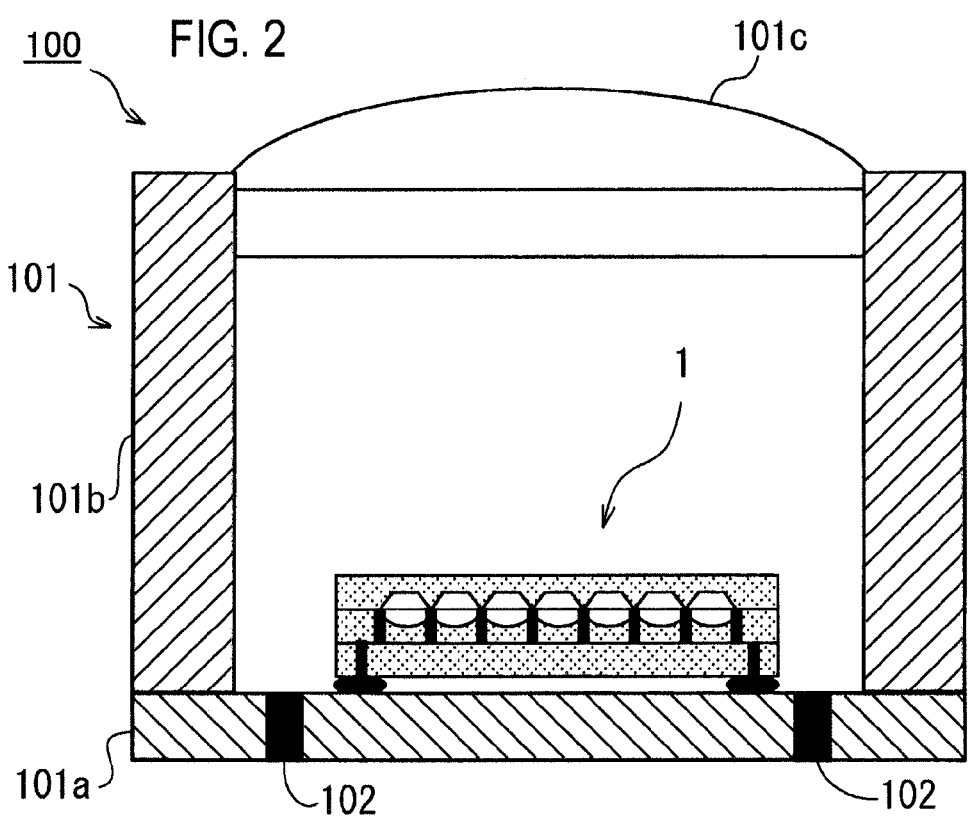
FIG. 2 is a schematic cross-sectional view of an infrared sensor module according to an embodiment of the invention.

With reference to FIGS. 1 to 7, an infrared sensor and an infrared sensor module according to an embodiment will be described. FIG. 1 is a schematic cross-sectional view of the infrared sensor according to an embodiment of the invention. FIG. 2 is a schematic cross-sectional view of the infrared sensor module according to an embodiment of the invention. FIGS. 3A to 3L are schematic views for explaining a method for manufacturing an infrared sensing device. FIGS. 4A to 4F are schematic views for explaining a method for manufacturing a reflection layer. FIGS. 5A to 5C are circuit configuration diagrams of the infrared sensor according to an embodiment. FIGS. 6A and 6B are schematic cross-sectional views of the infrared sensor according to an embodiment of the invention. FIGS. 7A to 7C are schematic cross-sectional views of the infrared sensor according to an embodiment of the invention.

<Configuration of Infrared Sensor>

As shown in FIG. 1, an infrared sensor 1 according to an embodiment of the invention has a configuration obtained by stacking together an infrared detecting device 2, a reflection layer 3, and a circuit board 4 each made of a silicon substrate.

The infrared detecting device 2 has a configuration such that an infrared sensing unit 21 using a thermopile and a reduced-pressure and sealed cavity 22 (i.e. a cavity at a pressure lower than the ambient pressure) are formed on a first substrate 20 made of silicon which can transmit infrared light.

The infrared sensing unit 21 is a sensing element using a thermopile having a property that voltage is generated when heat is applied. The thermopile receives infrared light emitted from an object, so that a temperature difference occurs and, due to so-called Seebeck effect, a voltage difference induced by the temperature difference is generated. The infrared sensing unit 21 is mounted on the bottom face of the first substrate 20, that is, on a face opposite to a face (top face) on which infrared light is incident from the outside, of the first substrate 20. On the top face of the first substrate 20, as necessary, a structure of preventing reflection of infrared light, an infrared filter for passing only infrared light having a specific frequency, and a light condensing element such as a diffraction grating or a lens can be formed.

The cavity 22 is formed inside the first substrate 20 at a position corresponding to the position at which the infrared sensing unit 21 is arranged. The cavity 22 is vacuum-sealed or sealed at low pressure close to vacuum. Thanks to the cavity 22, a space under vacuum or at low pressure is formed between the infrared sensing unit 21 and the outside.

The reflection layer 3 is disposed on the bottom face of the first substrate 20, i.e. on the side opposite to the external side of the infrared sensing device 2. The external side is the side intended to receive infrared light, i.e. the side on which infrared light is incident. The reflection layer 3 has a configuration such that a recess 31 is provided on a face of a second substrate 30 made of silicon opposed to the first substrate 20.

The surface of the recess 31 is covered with an infrared reflection film 32 made of a metal such as aluminum (Al) or gold (Au). The infrared reflection film 32 serves as an infrared reflection face capable of reflecting and focusing the infrared light passed through the sensing device 2 and not intercepted by the sensing unit 21 toward the sensing unit 21. The recess 31 is arranged in a position corresponding to the position of the infrared sensing unit 21. By providing the reflection film 3 on the infrared sensing device 2, a reduced-pressure and sealed space 33 surrounding the sensing unit 21 is generated. The sealed space 33 is vacuum-sealed or sealed at low pressure close to vacuum.

The reflection layer 3 has connecting means 34 including a wire for electrically connecting the sensing unit 21 and the circuit board 4. The wire is arranged so as to penetrate in the stack direction of the reflection layer 3.

The circuit board 4 is a circuit board obtained by mounting an arithmetic circuit 41 including an amplification circuit and an integration circuit for amplifying and integrating an output signal from the sensing unit 21 on a third substrate 40 made of silicon. The arithmetic circuit 41 is connected to the sensing unit 21 of the infrared sensing device 2 via the wire provided for the reflection layer 3. An output signal from the sensing unit 21, which is amplified or integrated by the arithmetic circuit 41 is transmitted via an output pad 42.

Figure 5A:
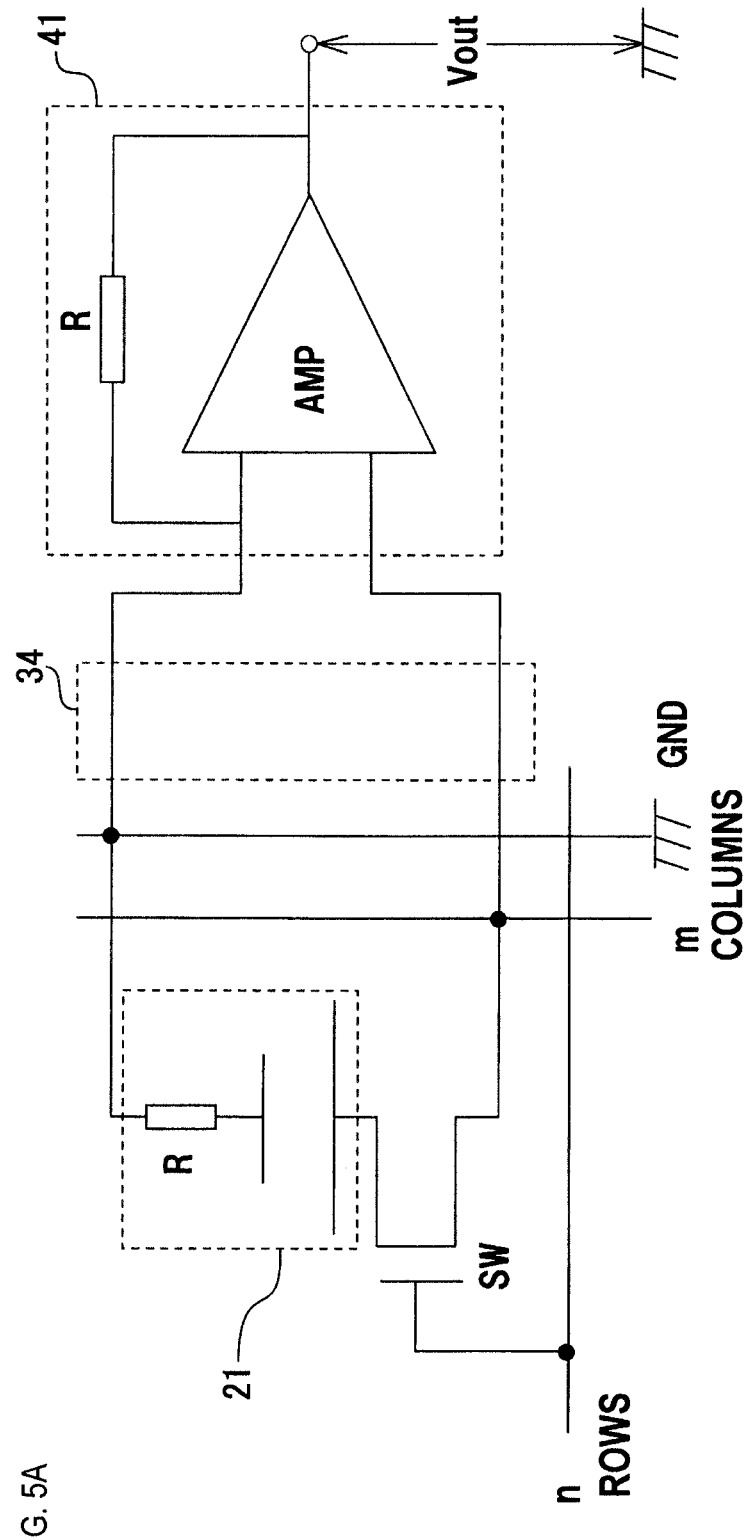
FIG. 5A is a circuit configuration view of an infrared sensor according to an embodiment of the present invention.
Figure 5B:
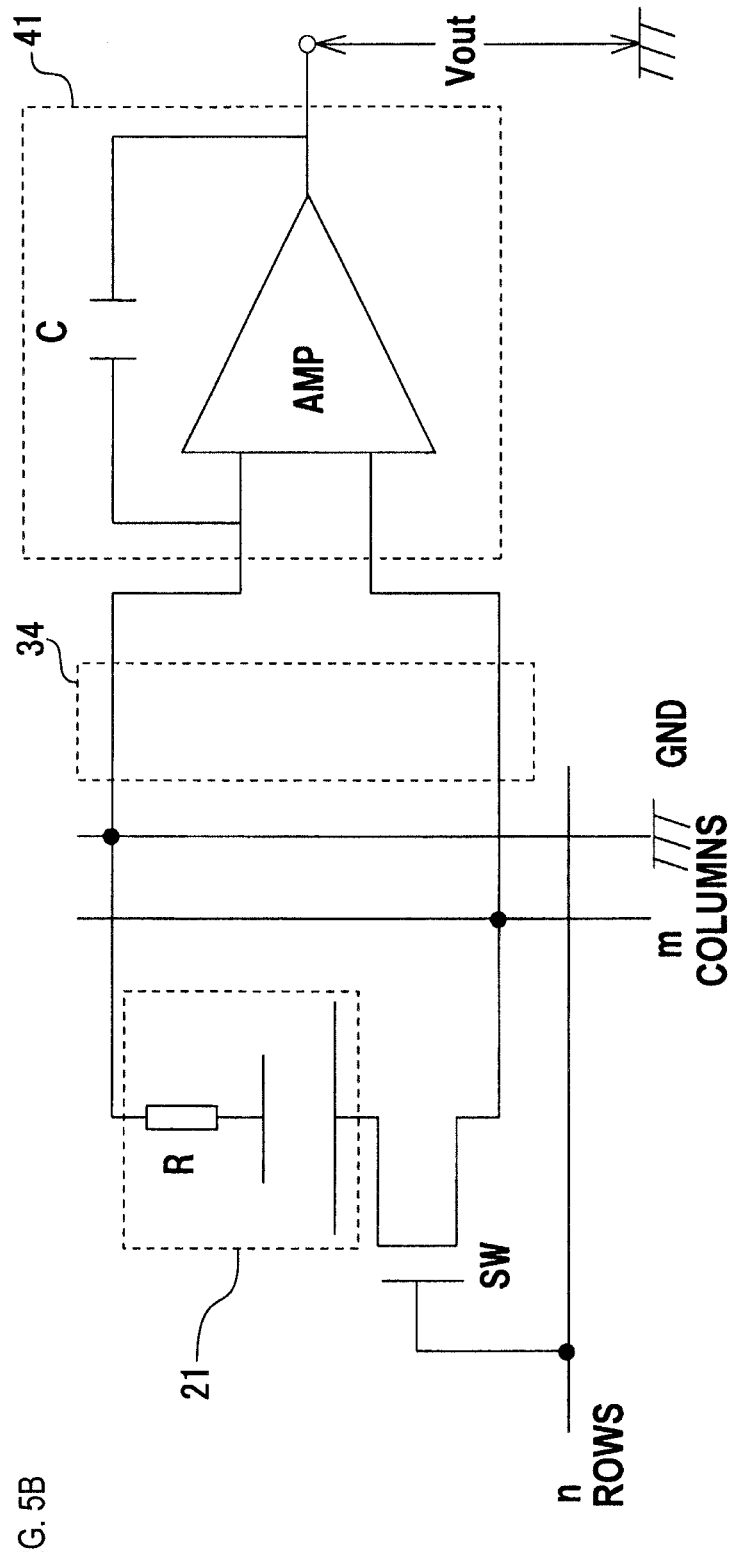
FIG. 5B is a circuit configuration view of the infrared sensor according to an embodiment of the present invention.
Figure 5C:
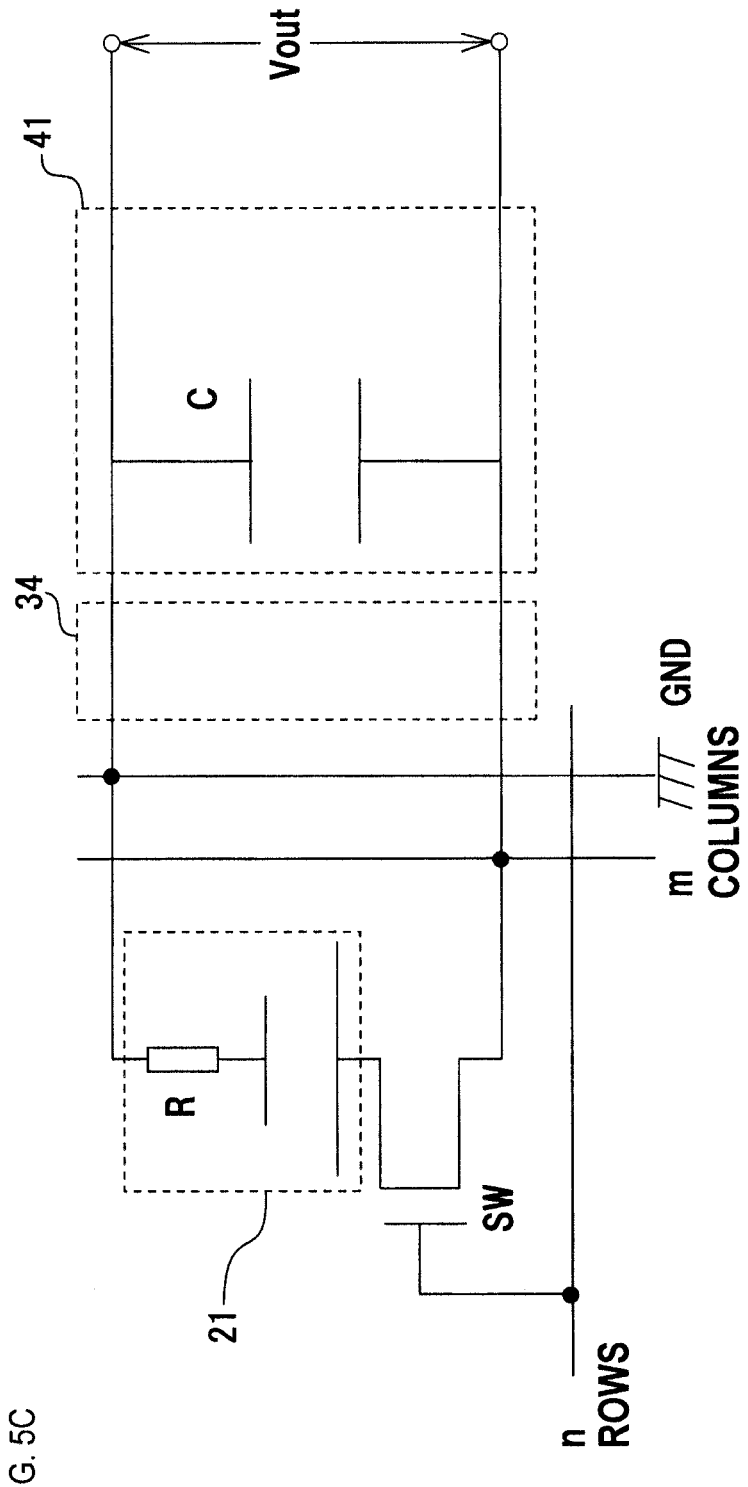
FIG. 5C is a circuit configuration view of the infrared sensor according to an embodiment of the present invention.

FIGS. 5A to 5C show examples of the circuit configuration of the sensing unit 21 and the arithmetic circuit 41. FIG. 5A shows a circuit configuration in the case where the arithmetic circuit 41 has an amplification circuit. FIG. 5B shows a circuit configuration in the case where the arithmetic circuit 41 has an amplification circuit and an integration circuit. FIG. 5C shows a circuit configuration using two connecting means 34 including a pair of electrodes of a capacitor as a component of the integration circuit.

The infrared sensor 1 according to an embodiment is constructed as an array sensor in which a plurality of infrared sensing units 21 is arranged in the vertical and horizontal directions (n rows×m columns). A plurality of cavities 22, a plurality of recesses 32, and a plurality of arithmetic circuits 41 are arranged at positions corresponding to the positions of the infrared sensing units 21.

<Operation of Infrared Sensor>

In the infrared sensor 1 constructed as described above, the infrared sensing unit 21 of the infrared sensing device 2 receives infrared light either directly from the outside via the cavity 22 (arrow or indirectly by reflection of the infrared light by the reflection film 32 of the reflection layer 3 (arrow 12). Since the infrared light emitted by the arithmetic circuit 41 by generation of heat is diffused by the reflection film 32, it is not intercepted by the sensing unit 21 (arrow I3).

The infrared sensing unit 21 of the infrared sensor 1 according to an embodiment is an infrared sensing element of a thermopile type using the so-called Seebeck effect, that is, a phenomenon taking place when a hot junction is warmed by converting infrared light absorbed by the infrared absorption film to into heat. When a temperature difference occurs between the hot junction and a cold junction, between the hot junction and the cold junction a voltage difference corresponding to the temperature difference is generated. The detection principle of the thermopile method is known per se, and its detailed description will not be given.

The sensing unit 21 outputs the voltage difference upon receipt of the infrared light. The arithmetic circuit 41 amplifies or integrates an output signal from the sensing unit 21 and outputs it via the output pad 42. Only by detecting the voltage difference as a function of a temperature change, the temperature of an object can be sensed.

<Infrared Sensor Module>

As shown in FIG. 2, an infrared module 100 according to an embodiment includes: the above-described infrared sensor 1 and a case 101 housing the infrared sensor 1. The case 101 includes a stem 101a on which the infrared sensor 1 is mounted, a cylindrical part 101 surrounding the periphery of the infrared sensor 1, and a window part 101c for receiving infrared light into the case 101. The stem 101a is provided with output terminals 102 for transmitting an output from the infrared sensor 1 to the outside. The window part 101c includes, for example, a lens suitable for focusing infrared light such as a Fresnel lens, an infrared filter passing only infrared light having a specific frequency, or the like.

<Method for Manufacturing Infrared Sensor>

A method for manufacturing the infrared sensor 1 according to an embodiment will be described. The infrared sensor 1 is manufactured by forming each of the infrared sensing device 2, the reflection layer 3, and the circuit board 4 and then stacking them together. In the following, a method for manufacturing the infrared sensing device 2 and a method for manufacturing the reflection layer 3 will be described. The manufacturing methods described below comprise steps which are known per se and will be therefore described briefly. A method for manufacturing the circuit board 4 will not be described since it is sufficient to perform a method for manufacturing a circuit board having an amplification circuit and an integration circuit by a known CMOS process or the like. The amplification circuit and the integration circuit may be mounted directly on the second substrate 30 of the reflection layer 3 without providing the circuit board 4.

<<Infrared Sensing Device>>

With reference to FIGS. 3A to 3L, a method for manufacturing the infrared sensing device 2 will be described.

Figure 3A:
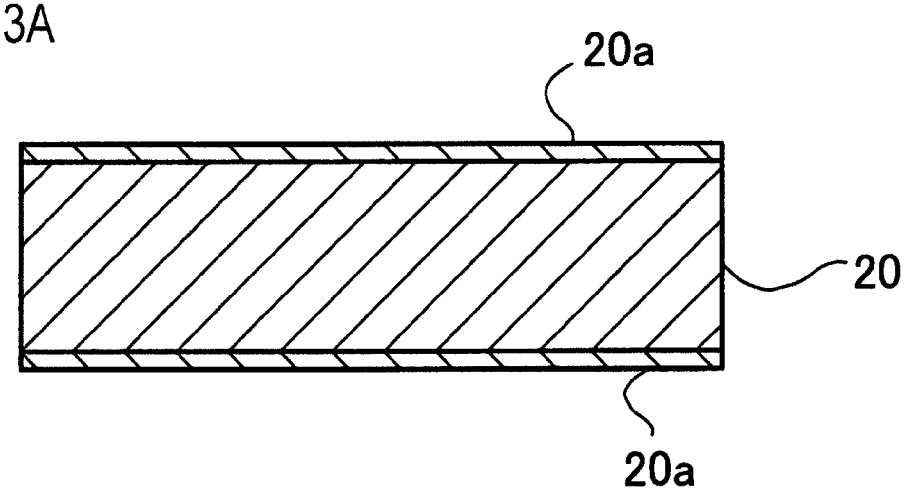
FIG. 3A is a schematic view for explaining a method for manufacturing an infrared detecting device.
Figure 3D:
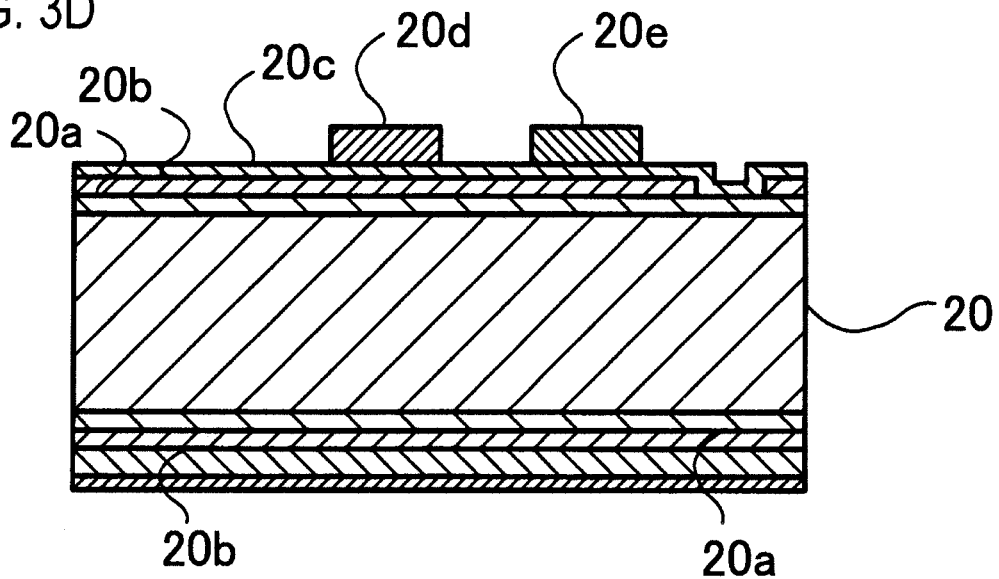
FIG. 3D is a schematic view for explaining the method for manufacturing an infrared detecting device.
Figure 3E:
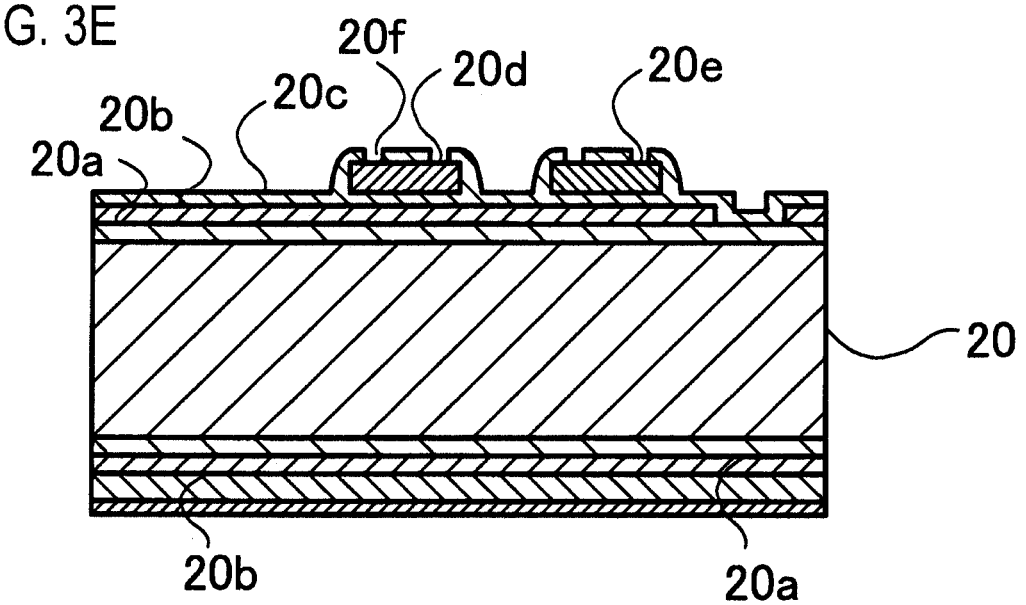
FIG. 3E is a schematic view for explaining the method for manufacturing an infrared detecting device.
Figure 3H:
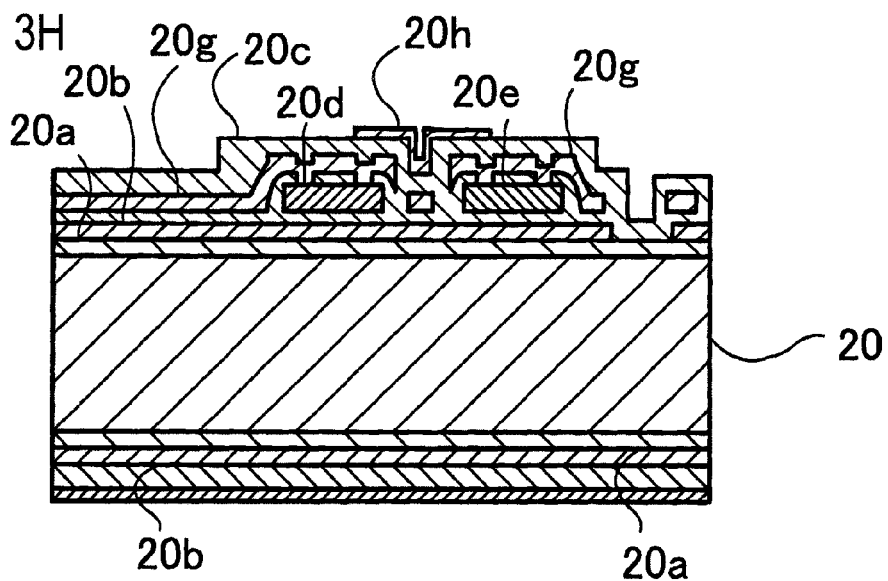
FIG. 3H is a schematic view for explaining the method for manufacturing an infrared detecting device.
Figure 3I:
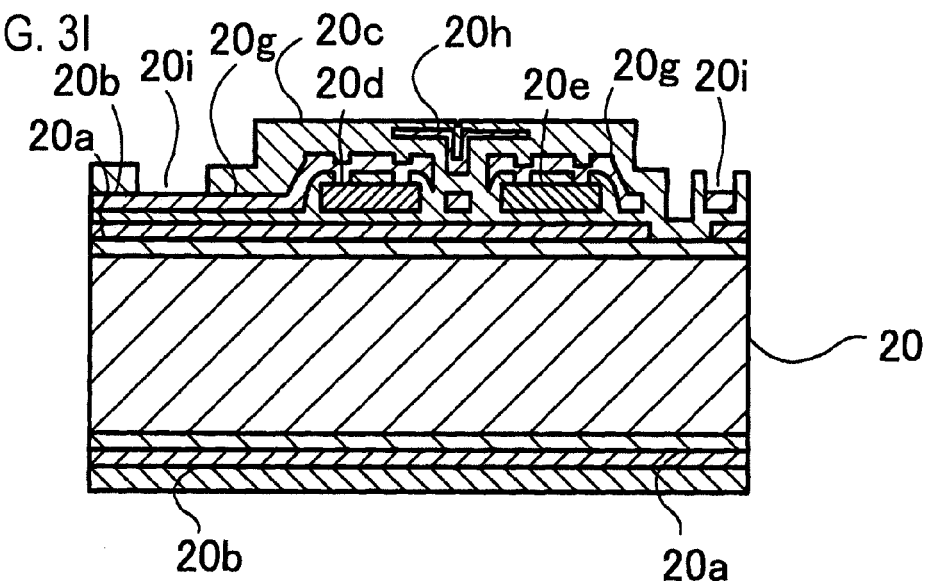
FIG. 3I is a schematic view for explaining the method for manufacturing an infrared detecting device.

First, the surface of the first substrate 20 is covered with an oxide layer 20a (FIG. 3A), and a nitride layer 20b is formed on the oxide layer 20a (FIG. 3B). On an oxide layer 20c formed on the nitride layer 20b (FIG. 3C), thermopiles (a hot junction 20d and a cold junction 20e) are formed (FIG. 3D). The surfaces of the thermopiles are also covered with the oxide layer 20c, and contact holes 20f are formed in a part of the oxide layer 20c (FIG. 3E). A metal interconnection 20g is formed so as to fill the contact holes 20f (FIG. 3F). The oxide layer 20c is formed on the metal interconnection 20g to form an insulating film (FIG. 3G). On the insulting film, an infrared absorption film 20h is formed (FIG. 3H). The infrared absorption film 20h is covered with the oxide layer 20c to forma protection film (FIG. 3I). Further, the oxide layer 20c is partially removed to form contact holes 20i to expose the metal interconnection 20g (FIG. 3I). A jointing part 20j is formed so as to cover the contact hole 20i (FIG. 3J), and an etching hole 20k to expose the first substrate 20 is formed (FIG. 3K). Via the etching hole 20k, the first substrate 20 is etched to form the cavity 22 (FIG. 3L).

<<Reflection Layer>>

With reference to FIGS. 4A to 4F, a method for manufacturing the reflection layer 3 will be described.

Figure 4C:
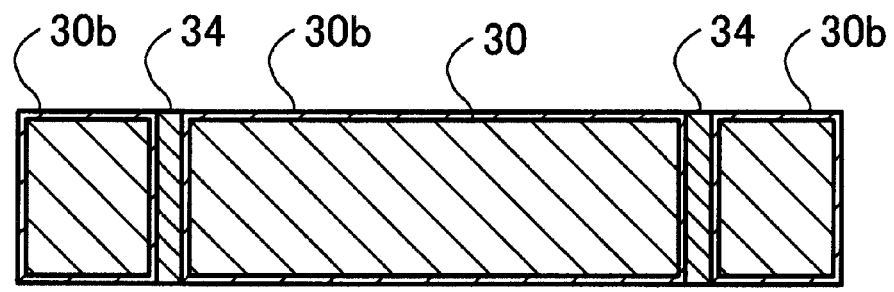
FIG. 4C is a schematic view for explaining the method for manufacturing a reflection layer.

Through holes 30a for the connecting means 34 are formed by etching the second substrate 30 (FIG. 4A) and an insulating film 30b is formed by an oxide layer or the like on the through holes 30a and the peripheral faces thereof (FIG. 4B). By burying metal plating, metal nanoparticles, polysilicon, or the like into the penetration hole 30a, the connecting means 34 is formed (FIG. 4C). It may be formed by a conventional damascene method. Subsequently, the recess 31 is formed by etching (FIG. 4D).

Figure 4D:
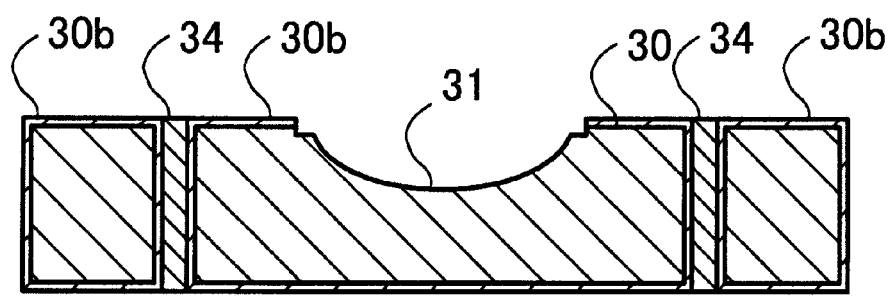
FIG. 4D is a schematic view for explaining the method for manufacturing a reflection layer.
Figure 4D:
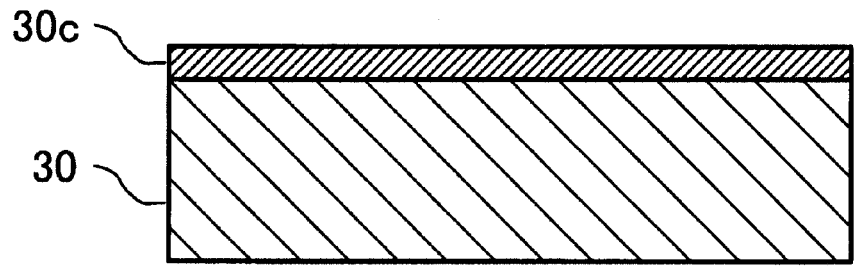

The recess 31 is formed by applying a resist on the surface of the second substrate 30 (FIG. 4D1) and forming a pattern (FIG. 4D2). Using the property that depth changes according to the size of the pattern, the surface of the second substrate 30 is roughly etched by anisotropic etching to roughly form the shape of the recess 31 (FIG. 4D3). After that, by isotropic etching, the second substrate 30 is generally etched to finish the shaping of the recess 31 (FIG. 4D4). As an alternative method, a method using only isotropic etching, a process by sandblasting, or thermal transfer using a mold made of graphite may be employed.

In an embodiment, as shown in the diagram, the position of the opening of the recess 31 is lower than the top surface of the second substrate 30. Accordingly, the reflection face 32 is positioned away from the surface, so that the range of incident light is limited, thereby achieving reduction of crosstalk. A concrete shape of the recess 31 is not limited to the shape shown in the diagram. For example, according to an arrangement on the array, the curvature or the like may be changed so that sensitivity becomes higher to light with a specific incident angle.

Figure 4E:
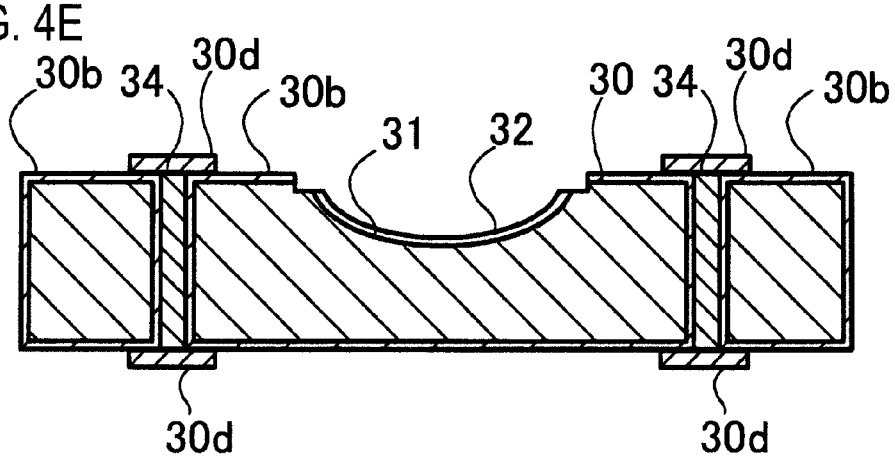
FIG. 4E is a schematic view for explaining the method for manufacturing a reflection layer.
Figure 4F:
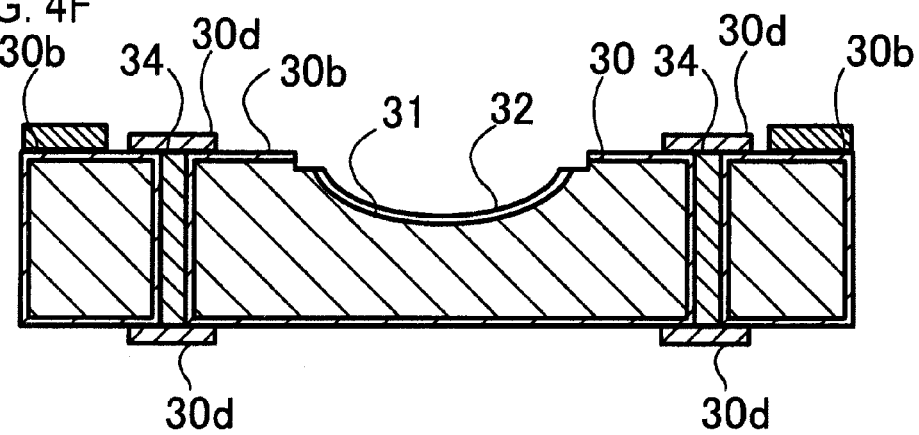
FIG. 4F is a schematic view for explaining the method for manufacturing a reflection layer.

After formation of the recess 31, the infrared reflection film 32 made of aluminum, gold, or the like is formed on the surface of the recess 31, and pads 30d made of aluminum, gold, or the like are formed at the ends of the connecting means 34 (FIG. 4E). Finally, on the outside of the pads 30d, a joining part for sealing and joining the reflection layer 3 and the infrared sensing device 2 is formed by using tetraethoxysilane (TEOS), gold particles, gold-tin (AuSn), polymer, or the like (FIG. 4F).

The infrared sensing device 2 and the reflection layer 3 formed as described above are stacked and joined together under vacuum or under low pressure close to vacuum. Therefore, the cavity 22 in the infrared sensing device 2 and the sealed space 33 formed by the recess 31 are subjected to pressure reduction and sealing.

ADVANTAGES OF EMBODIMENTS OF THE INVENTION

In the infrared sensor 1 according to an embodiment, the infrared sensing unit 21 and the arithmetic circuit 41 are configured to be integrated, so that the distance between the infrared sensing unit 21 and the arithmetic circuit 41 can be made short. Therefore, reduction of noise and improvement in detection precision can be achieved.

Heat (infrared) gene rated in the arithmetic circuit 41 is interrupted by the reflection face 32 between the infrared sensing unit 21 and the arithmetic circuit 41, so that an adverse influence on the detection precision of the sensing unit 21 exerted by the heat of the arithmetic circuit 41 is suppressed.

Since the infrared light incident on the infrared sensing unit 21 passes through the reduced-pressure and sealed cavity 22 and the reduced-pressure space 33, deterioration in sensitivity due to escape of the heat to air is suppressed, and temperature can be detected with high sensitivity.

The infrared light passed through the infrared sensing device 2 and not intercepted by the infrared sensing unit 21 depending on the incident position and the incident angle is reflected by the reflection face 32 and focused toward the infrared sensing unit 21. Thus, detection sensitivity can be improved.

Since the pressure reduction and sealing of the cavity and sealed space are performed in the semiconductor process, sealing with high stability can be performed. As a result, the workability can be improved and the manufacture cost can be reduced.

By connecting the sensing unit 21 and the arithmetic circuit 41 via the connecting means 34, a compact stack structure can be realized, and the sensor can be miniaturized. Therefore, reduction in noise and improvement in detection precision can be realized.

As shown in FIG. 5C, by using two connecting means 34 including electrodes of a capacitor for integrating an output signal of the sensing unit 21, it becomes unnecessary to separately or additionally provide a capacitor for the integration circuit. Thus, miniaturization of the sensor can be realized.

Since the arithmetic process of amplification or integration is performed by one arithmetic circuit 41 for one sensing unit 21, detection with high precision is possible.

In the infrared sensor module 100 according to an embodiment, the reduced-pressure space for increasing precision of detection of the infrared sensing unit 21 is formed in the sensor 1 itself, so that it is unnecessary to reduce the pressure in the case 101 housing the sensor 1. Therefore, the number of the manufacturing steps of the module can be reduced.

In addition, air tightness is not required for the case 101 itself, so that the variety of the materials of the case and selection of adhesives may be widened. Therefore, the material cost can be reduced and the manufacture cost can be reduced.

Therefore, according to an embodiment, reduction in noise and improvement in detection precision can be realized, and the manufacture cost can be reduced.

<Others>

Because the sensing unit and the arithmetic circuit are stacked and integrated together, and connected via the connecting means 34, the flexibility of interconnection is high. In one of the embodiments, the output pads 42 are provided on the bottom face of the circuit board 4. However, the positions of the output pads 42 can be placed elsewhere. In the configuration of the embodiments described above, ball mounting is possible.

Figure 6A:
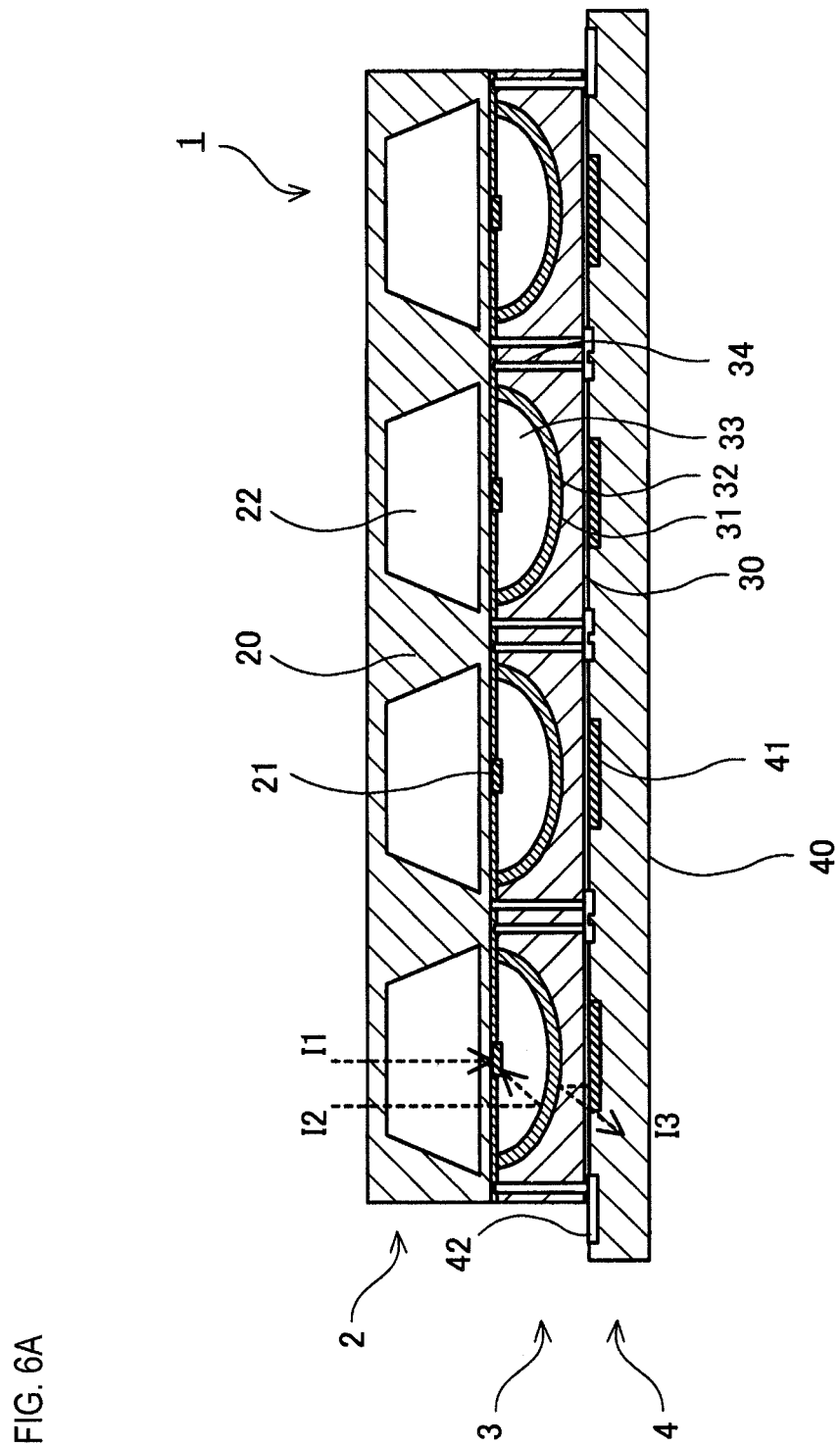
FIG. 6A is a schematic cross-sectional view of an infrared sensor according to an embodiment of the present invention.
Figure 6B:
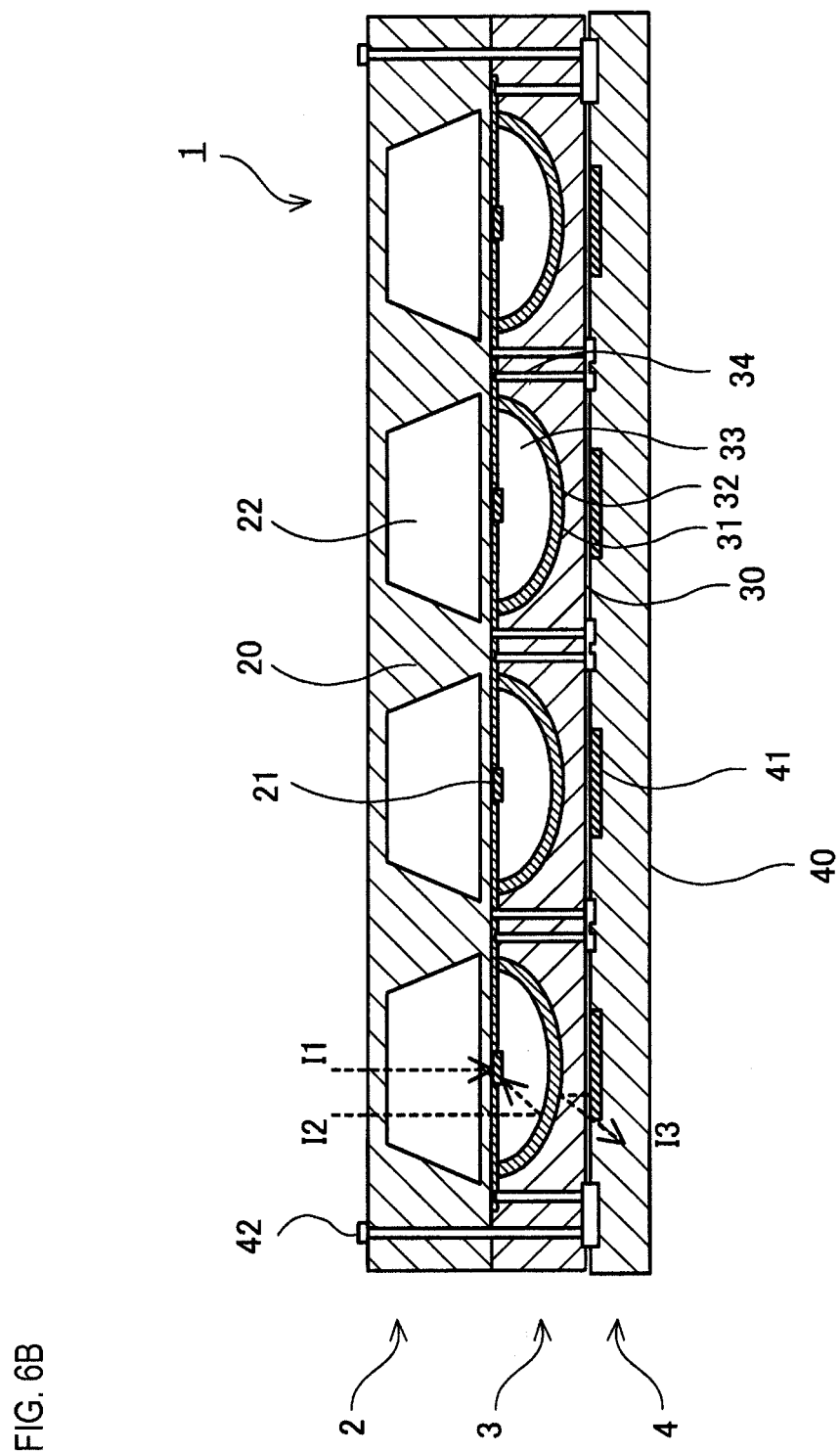
FIG. 6B is a schematic cross-sectional view of the infrared sensor according to an embodiment of the present invention.

For example, as shown in FIG. 6A, the output pad 42 may be formed so as to extend to a side from the joined face of the reflection layer 3 and the circuit board 4. As shown in FIG. 6B, the output pad 42 may be formed so as to extend from the top face of the first substrate 20 of the semiconductor sensing device 2 by the connecting means. With this configuration, wire bonding becomes possible.

Figure 7B:
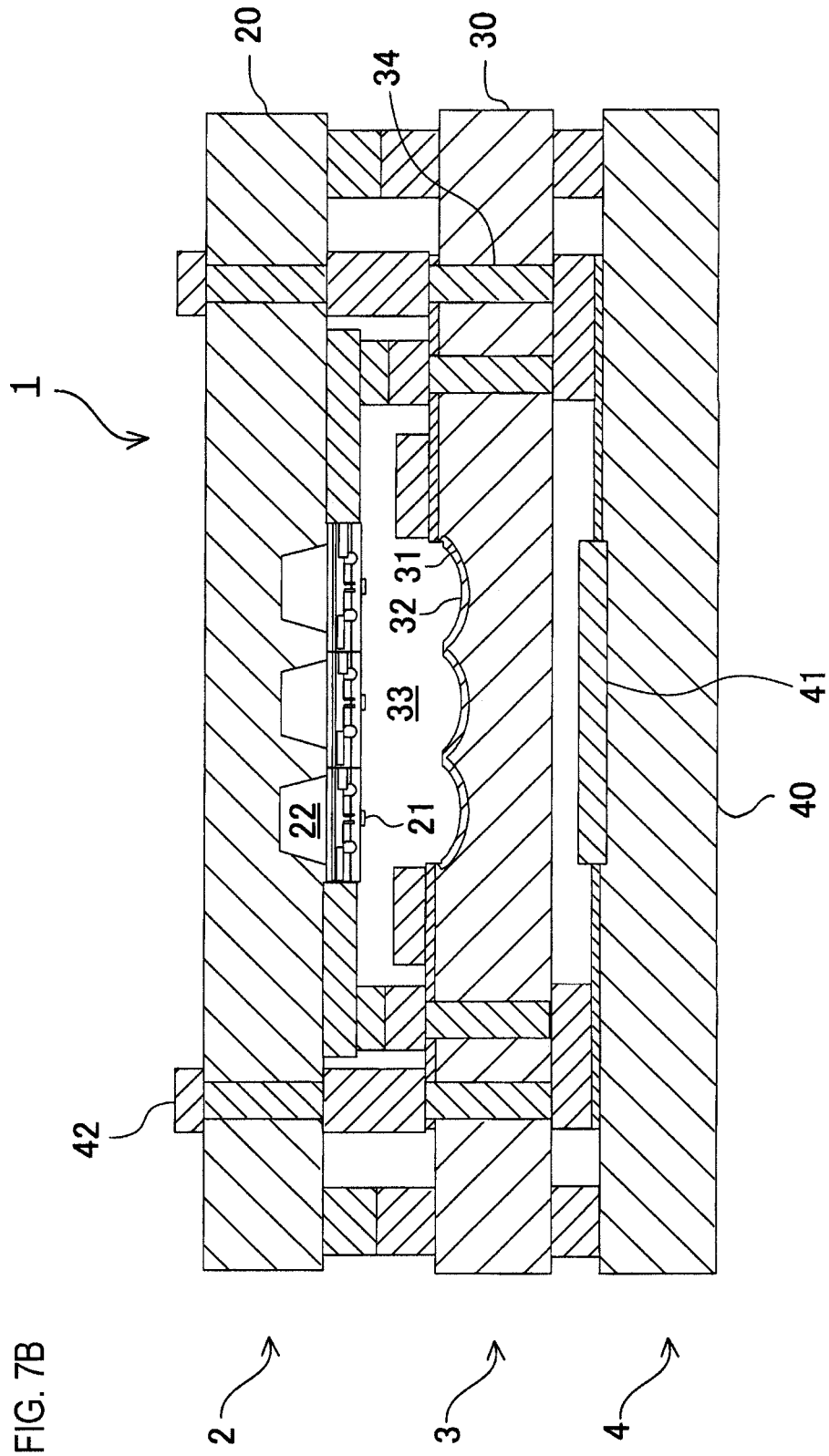
FIG. 7B is a schematic cross-sectional view of the infrared sensor according to an embodiment of the present invention.

In the embodiments described above, the infrared sensing unit 21, the cavity 22, and the reflection film 32 are independent of each other. However, the invention is not limited to this configuration. For example, as shown in FIGS. 7A and 7B, by making the depth of the anisotropic etching vary by varying patterning at the time of forming the recess 31 by etching, a plurality of recesses 31 may be formed simultaneously by formation of a single recess 31.

Figure 7C:
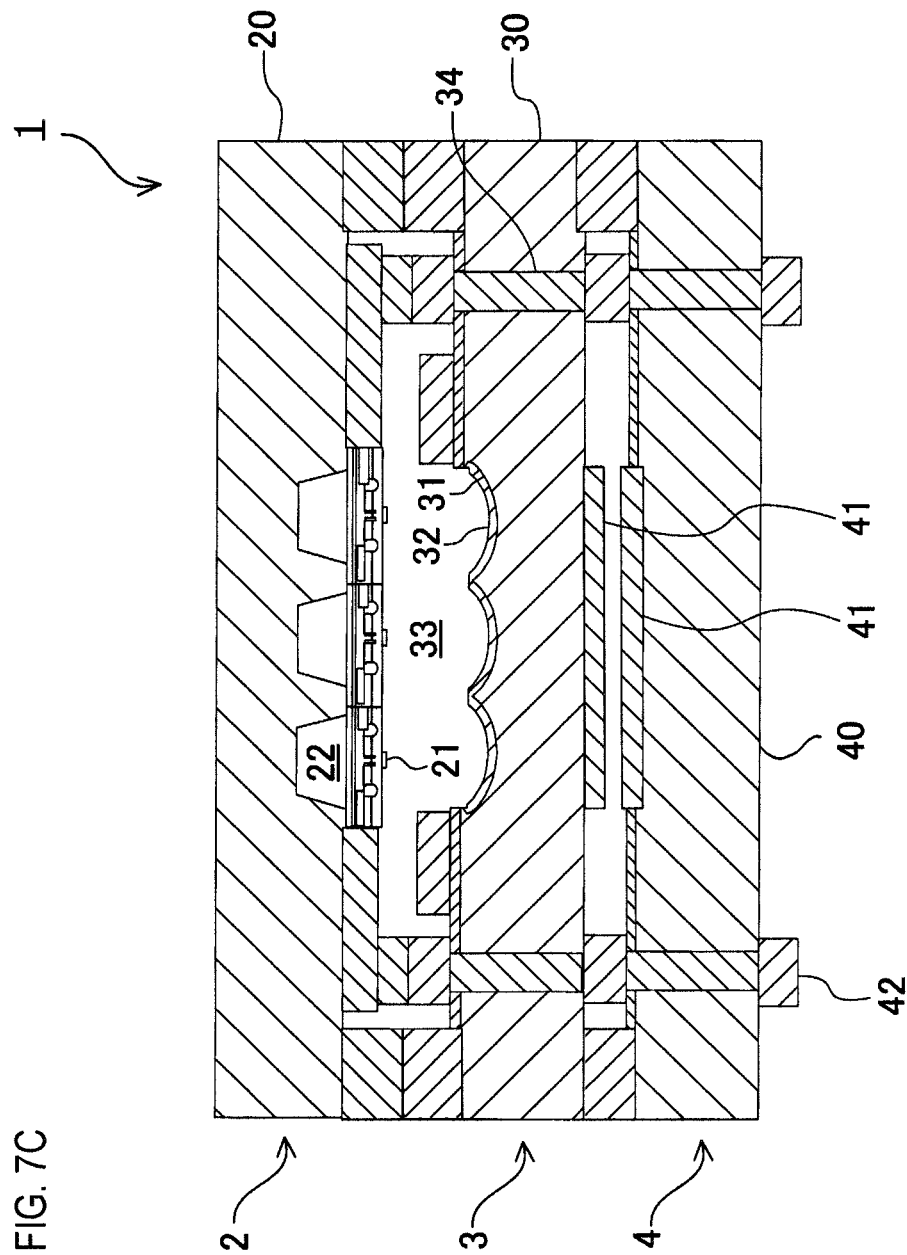
FIG. 7C is a schematic cross-sectional view of the infrared sensor according to an embodiment of the present invention.

It is also possible to form a pair of electrodes of a capacitor by two arithmetic circuits 41 as shown in FIG. 7C and use it for the integration circuit.

What is claimed is:

1. An infrared sensor comprising:
   a first substrate transmitting infrared light and comprising at least one reduced-pressure and sealed cavity;
   at least one infrared sensing unit provided on a side of the first substrate opposite to a side intended to receive infrared light from the outside, the at least one infrared sensing unit generating an output change upon receipt of the infrared light passed through the at least one reduced-pressure and sealed cavity, the at least one reduced-pressure and sealed cavity being formed inside the first substrate at a position where the infrared sensing unit is arranged;
   a second substrate stacked on the first substrate and comprising:
   at least one recess forming a reduced-pressure space surrounding the at least one infrared sensing unit in cooperation with the first substrate, and
   a reflection face capable of reflecting the infrared light passed through the first substrate and not intercepted by the at least one infrared sensing unit toward the at least one infrared sensing unit; and
   at least one arithmetic circuit amplifying or integrating an output of the at least one infrared sensing unit, the at least one arithmetic circuit being integrated with the at least one infrared sensing unit and arranged in such a manner that the reflection face is sandwiched between the at least one infrared sensing unit and the at least one arithmetic circuit.

2. The infrared sensor according to claim 1, wherein the at least one reduced-pressure and sealed cavity is open on the side of the first substrate on which the second substrate is stacked, and
   the at least one reduced-pressure and sealed cavity and the reduced-pressure space are subjected to a reduced pressure and sealed by stacking and bonding the first and second substrates under low pressure.

3. The infrared sensor according to claim 1, wherein the at least one infrared sensing unit and the at least one arithmetic circuit are connected by means of connecting means penetrating the second substrate in a stack direction.

4. The infrared sensor according to claim 3, including a plurality of connecting means.

5. The infrared sensor according to claim 1, including:
   a plurality of infrared sensing units; and
   a plurality of arithmetic circuits corresponding to the plurality of infrared sensing units.

6. The infrared sensor according to claim 1, wherein the at least one arithmetic circuit is formed on a side opposite to the side on which the first substrate is stacked on the second substrate.

7. The infrared sensor according to claim 1, further comprising a third substrate stacked on the side of the second substrate opposite to the first substrate,
   wherein the at least one arithmetic circuit is formed on the third substrate.

8. An infrared sensor module comprising:
   the infrared sensor according to claim 1; and
   a case housing the infrared sensor.

* * * * *